(12) United States Patent
Lu et al.

(10) Patent No.: US 11,469,321 B2
(45) Date of Patent: Oct. 11, 2022

(54) SEMICONDUCTOR DEVICE

(71) Applicant: Taiwan Semiconductor Manufacturing Company, Ltd., Hsinchu (TW)

(72) Inventors: Ze-Sian Lu, Hsinchu (TW); Ting-Wei Chiang, New Taipei (TW); Pin-Dai Sue, Tainan (TW); Jung-Hsuan Chen, Hsinchu (TW); Hui-Wen Li, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/803,261

(22) Filed: Feb. 27, 2020

(65) Prior Publication Data
US 2021/0273093 A1 Sep. 2, 2021

(51) Int. Cl.
*H01L 27/06* (2006.01)
*H01L 27/092* (2006.01)
(Continued)

(52) U.S. Cl.
CPC ...... *H01L 29/7831* (2013.01); *H01L 27/0688* (2013.01); *H01L 27/0922* (2013.01);
(Continued)

(58) Field of Classification Search
CPC ............... H01L 27/0688; H01L 27/092; H01L 27/0922; H01L 27/0924; H01L 27/0928; H01L 27/2481; H01L 29/8221; H01L 29/42392; H01L 21/823871; H01L 29/78696; H01L 21/823807; H01L 27/0207; H01L 29/0673; H01L 29/775; H01L 21/823821; H01L 23/535; H01L 27/0886; H01L 29/0847; H01L 29/66439; H01L 29/66545; H01L 29/785; H01L 21/76895; H01L 21/823431; H01L 21/823828; H01L 21/823842; H01L 23/528; H01L 23/5286; H01L 27/088; H01L 29/4908; H01L 29/66795; H01L 2027/11875; H01L 21/02603; H01L 21/28088; H01L 21/3065; H01L 21/743;
(Continued)

(56) References Cited

U.S. PATENT DOCUMENTS 10,833,078 B2 * 11/2020 Smith ............. H01L 21/823842
11,056,392 B2 * 7/2021 Li ........................ H01L 29/6681
(Continued)

FOREIGN PATENT DOCUMENTS

JP 2007-294857 A 11/2007
JP 2013-165132 A 8/2013
(Continued)

*Primary Examiner* — Maliheh Malek
(74) *Attorney, Agent, or Firm* — Merchant & Gould P.C.

(57) ABSTRACT

A semiconductor device includes: a first multi-gate field effect transistor (FET) disposed over a substrate, the first multi-gate FET including a first active region; and a second multi-gate FET disposed over the first multi-gate FET, the second multi-gate FET including a second active region. The (Continued)

first active region and the second active region are not fully projected in a vertical direction perpendicular to the substrate.

20 Claims, 7 Drawing Sheets

(51) Int. Cl.
   *H01L 29/423* (2006.01)
   *H01L 29/78* (2006.01)
   *H01L 29/66* (2006.01)
   *H01L 27/24* (2006.01)

(52) U.S. Cl.
   CPC .. *H01L 29/42392* (2013.01); *H01L 29/66484* (2013.01); *H01L 29/7855* (2013.01); *H01L 27/0924* (2013.01); *H01L 27/2481* (2013.01)

(58) Field of Classification Search
   CPC ....... H01L 21/82347; H01L 21/823475; H01L 21/845; H01L 27/1104; H01L 27/11578; H01L 27/1211; H01L 27/124; H01L 2924/0002; H01L 2027/11881; H01L 2029/7858; H01L 21/02181; H01L 21/02532; H01L 21/0262; H01L 21/28518; H01L 21/30604; H01L 21/30625; H01L 21/74; H01L 21/76; H01L 21/762; H01L 21/76224; H01L 21/76267; H01L 21/76283; H01L 21/768; H01L 21/76805; H01L 21/823814; H01L 21/823864; H01L 21/823878; H01L 21/84; H01L 23/481; H01L 23/522; H01L 23/5226; H01L 23/552; H01L 25/00; H01L 27/10808; H01L 27/11; H01L 27/1108; H01L 27/11519; H01L 27/11524; H01L 27/11551; H01L 27/11565; H01L 27/11573; H01L 27/11582; H01L 27/11807; H01L 27/1207; H01L 27/1248; H01L 27/2454; H01L 27/3218; H01L 27/3276; H01L 29/0646; H01L 29/0649; H01L 29/0657; H01L 29/0665; H01L 29/0692; H01L 29/0696; H01L 29/1037; H01L 29/1079; H01L 29/24; H01L 29/401; H01L 29/42376; H01L 29/4238; H01L 29/517; H01L 29/66477; H01L 29/66575; H01L 29/66772; H01L 29/6681; H01L 29/78; H01L 29/7848; H01L 29/7851; H01L 29/78654; H01L 29/792; H01L 2924/00; H01L 45/06; H01L 45/1233; H01L 45/144; H01L 45/1608

See application file for complete search history.

(56) References Cited

U.S. PATENT DOCUMENTS

| | | | |
|---|---|---|---|
| 11,088,085 B2* | 8/2021 | Cheng | H01L 21/762 |
| 2005/0151276 A1 | 7/2005 | Jang et al. | |
| 2006/0050941 A1 | 3/2006 | Middleton et al. | |
| 2007/0228478 A1 | 10/2007 | Mikasa | |
| 2008/0211568 A1 | 9/2008 | Pacha et al. | |
| 2012/0068241 A1* | 3/2012 | Sakuma | H01L 27/11551 257/314 |
| 2012/0181602 A1* | 7/2012 | Fukuzumi | H01L 27/1207 257/326 |
| 2012/0273895 A1 | 11/2012 | Anderson et al. | |
| 2013/0200331 A1* | 8/2013 | Morikawa | H01L 45/1233 257/5 |
| 2013/0207112 A1 | 8/2013 | Isobe et al. | |
| 2014/0027758 A1 | 1/2014 | Hong et al. | |
| 2016/0211276 A1 | 7/2016 | Liu et al. | |
| 2017/0098641 A1* | 4/2017 | Jung | H01L 27/0207 |
| 2018/0006009 A1* | 1/2018 | Lin | H01L 27/092 |
| 2018/0026042 A1 | 1/2018 | Smith et al. | |
| 2018/0040695 A1 | 2/2018 | Smith et al. | |
| 2018/0151411 A1* | 5/2018 | Yang | G06F 30/394 |
| 2019/0096811 A1* | 3/2019 | Wang | H01L 23/535 |
| 2019/0172828 A1* | 6/2019 | Smith | H01L 27/124 |
| 2019/0326286 A1* | 10/2019 | Xie | H01L 29/0665 |
| 2019/0355756 A1 | 11/2019 | Nelson et al. | |
| 2020/0074043 A1* | 3/2020 | Chang | G06F 30/398 |
| 2020/0075574 A1* | 3/2020 | Smith | H01L 27/0688 |
| 2020/0104460 A1* | 4/2020 | Peng | H01L 21/823871 |
| 2020/0235098 A1* | 7/2020 | Li | H01L 27/0207 |
| 2020/0327273 A1* | 10/2020 | Peng | H01L 27/0688 |
| 2020/0328212 A1* | 10/2020 | Wu | H01L 21/823871 |
| 2020/0365464 A1* | 11/2020 | Sreenivasan | H01L 29/66795 |
| 2020/0381430 A1* | 12/2020 | Liebmann | H01L 29/0847 |
| 2020/0411516 A1* | 12/2020 | Sue | H01L 27/0886 |
| 2021/0013086 A1* | 1/2021 | Peng | H01L 21/76283 |
| 2021/0035967 A1* | 2/2021 | Liebmann | H01L 27/0207 |
| 2021/0043630 A1* | 2/2021 | Liebmann | H01L 27/0928 |
| 2021/0074350 A1* | 3/2021 | Vincent | G11C 11/412 |
| 2021/0089698 A1* | 3/2021 | Hsieh | H01L 21/768 |
| 2021/0089700 A1* | 3/2021 | Lu | G03F 1/70 |
| 2021/0098456 A1* | 4/2021 | Huang | H01L 29/42392 |

FOREIGN PATENT DOCUMENTS

| | | |
|---|---|---|
| JP | 2013-197171 A | 9/2013 |
| JP | 2015-103531 A | 6/2015 |
| JP | 2019-523553 A | 8/2019 |
| JP | 2019525484 A | 9/2019 |
| KR | 10-2006-0098045 A | 9/2006 |
| KR | 10-2015-0034273 A | 4/2015 |
| KR | 10-2015-0136058 A | 12/2015 |
| KR | 10-2019-0026018 A | 3/2019 |
| WO | 2014/158180 A1 | 10/2014 |

* cited by examiner

SEMICONDUCTOR DEVICE

BACKGROUND

As the semiconductor industry constantly strives for higher device density, higher performance, and lower costs, challenges from both fabrication and design issues have resulted in the development of three-dimensional designs, such as a multi-gate field effect transistor (FET), including a FinFET and a gate-all-around (GAA) FET. In a typical FinFET, a gate electrode is adjacent to three side surfaces of a channel region with a gate dielectric layer interposed therebetween. A complementary FET (CFET) typically includes a bottom FET disposed over a substrate and a top FET disposed above the bottom FET. A gate structure including a gate dielectric layer and a gate electrode layer is commonly formed around the channel region of the bottom and top FETs. Typically, the bottom FET is a first conductivity type (e.g., n-type) FET and the top FET is a second conductivity type (e.g., p-type) different from the first conductivity type, or vice versa.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
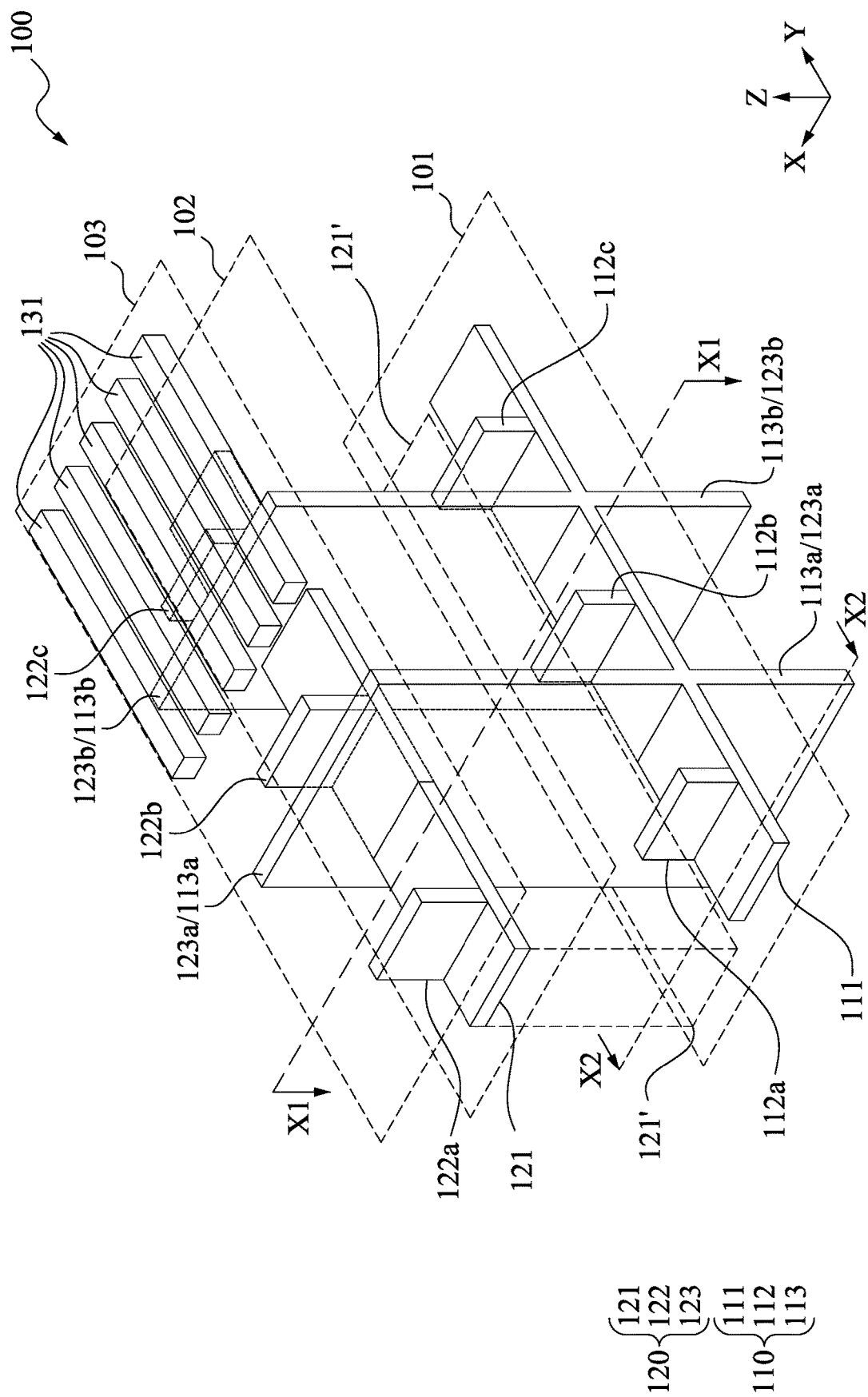
FIG. 1A is a perspective diagram illustrating an example of a CFET in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As transistor dimensions are scaled down, routing congestion can be a challenge. Specifically, a bottom FET of a complementary FET (CFET) has fewer routing tracks as compared with the top FET. Poor internal routability may lead to large chip area.

In the present disclosure, an example CFET with active regions not fully overlapping when viewed from above is disclosed. Specifically, a top active region of a top FET and a bottom active region of a bottom FET do not fully overlap when viewed from above. Since the active region of the bottom FET is not fully covered by the active region of the top FET when viewed from above, more routing flexibility of the bottom FET is created. As such, the example CFET can increase internal routability and potentially reduce chip areas.

Figure 1B:
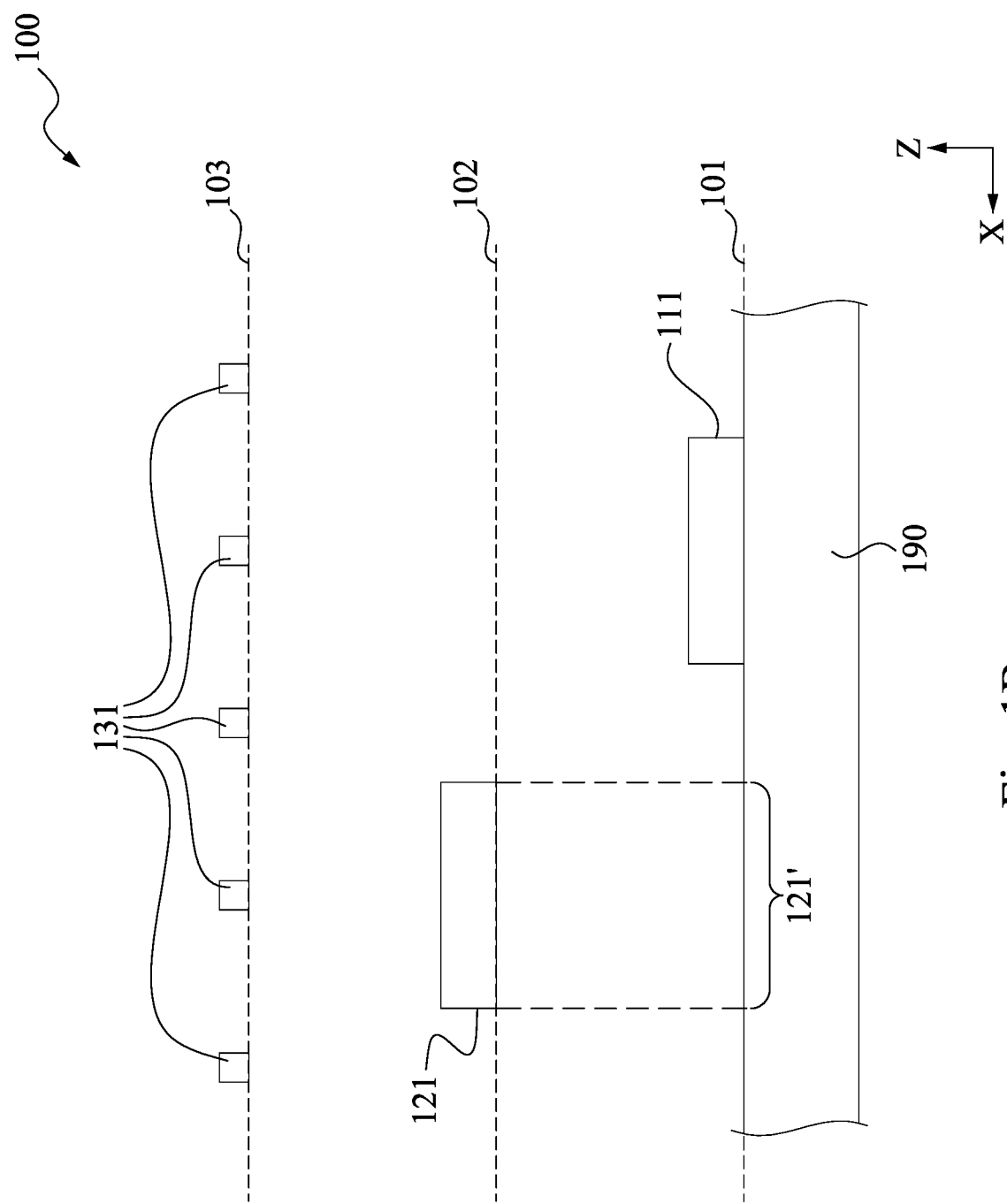
FIG. 1B is a cross sectional diagram illustrating the example CFET shown in FIG. 1A in accordance with some embodiments.
Figure 1C:
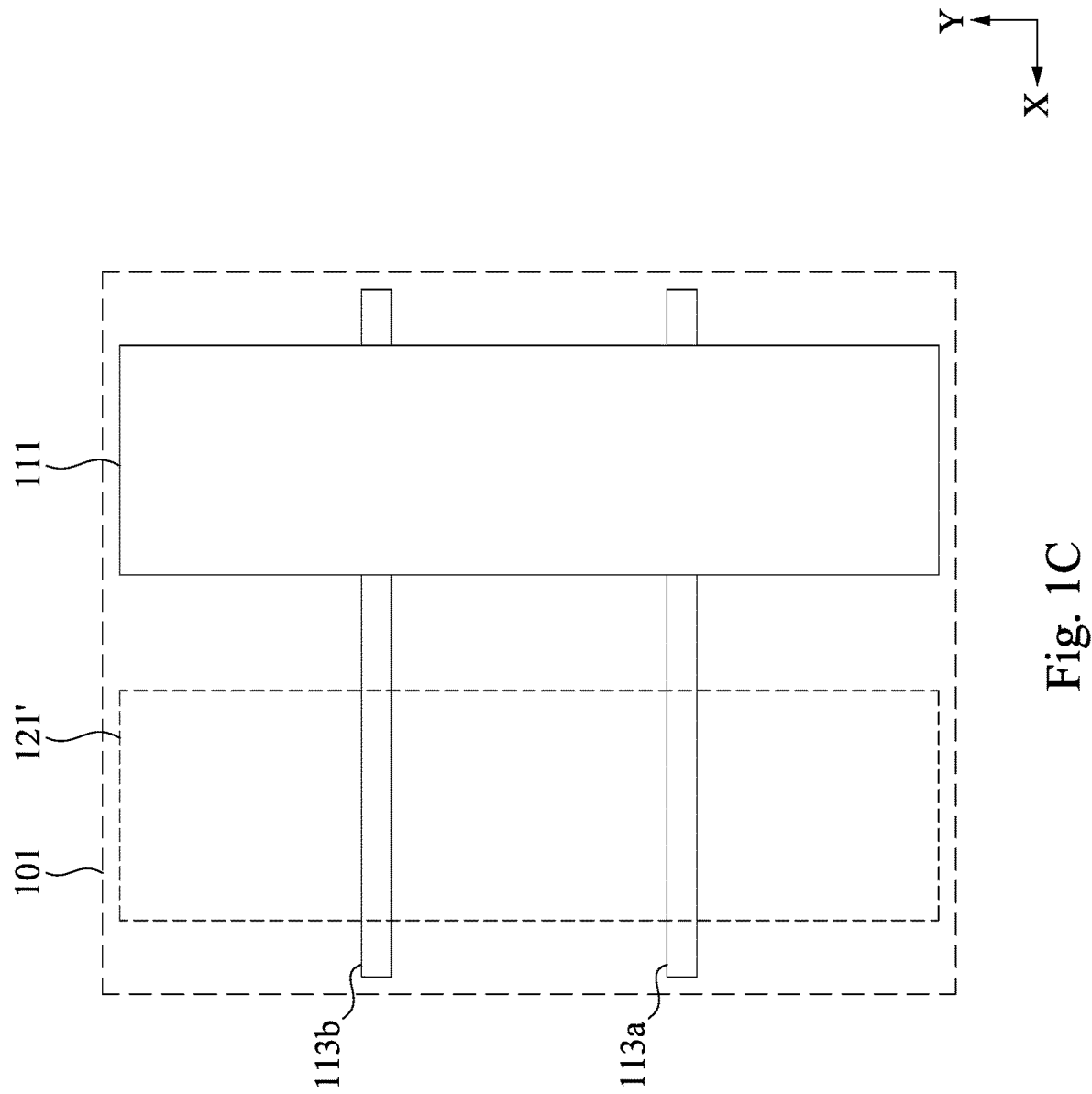
FIG. 1C is another cross sectional diagram illustrating the example CFET shown in FIG. 1A in accordance with some embodiments.

FIGS. 1A, 1B and 1C show an example of a CFET 100 in accordance with some embodiments. Specifically, FIG. 1A is a perspective view showing portions of the example CFET 100. FIG. 1B is a cross sectional view corresponding to a line X1-X1 of FIG. 1A. FIG. 1C is a cross sectional view corresponding to a line X2-X2 of FIG. 1A.

As shown in FIG. 1A, the example CFET 100 includes at least a bottom FET 110 and a top FET 120. In some embodiments, the bottom FET 110 is a bottom multi-gate FET. In some embodiments, the top FET 120 is a top multi-gate FET. In some embodiments, the bottom FET 110 and the top FET 120 are both FinFETs. In some embodiments, the bottom FET 110 and the top FET 120 are both GAA FETs.

The bottom FET 110 is disposed over a substrate 190 (shown in FIG. 1B). The bottom FET 110 includes at least a first active region 111, two metal contact regions 112 and a gate region (i.e., poly region) 113. For example, the bottom FET 110 may include, among other things, the first active region 111, a metal contact region 112a, a metal contact region 112b and a gate region 113a. In this embodiment, the first active region 111 is disposed on a first horizontal plane 101. The first horizontal plane 101 is in a X-Y plane which is perpendicular to the vertical direction (Z). The first active region 111 may define an active region where transistors may be constructed. In this embodiment, the first active region 111 is a first conductivity type (e.g., n-type). It should be noted that the first active region 111 may be a second conductivity type (e.g., p-type). In this embodiment, the metal contact regions 112a and 112b are disposed over the first active region 111. One of the metal contact regions 112a and 112b may serve as a source of the bottom FET 110, and the other may serve as a drain of the bottom FET 110. In one example, the metal contact region 112a may serve as a source of the bottom FET 110, whereas the metal contact region 112b may serve as a drain of the of the bottom FET 110. A source contact and a drain contact may be further disposed over the metal contact regions 112a and 112b to form a source terminal and a drain terminal of the bottom FET 110. In this embodiment, the gate region 113a is interposed between the metal contact regions 112a and 112b. The gate region 113a is adjacent to multiple (e.g., three or four) side surfaces of the first active region 111. The gate region 113a may serve as a gate of the bottom FET 110. A gate electrode may be further disposed around the gate region 113a to form a gate terminal of the bottom FET 110. It should be noted that the bottom FET 110 may include another combination of components. For instance, the bottom FET 110 may include, among other things, the first active region 111, a metal contact region 112b, a metal contact region 112c and a gate region 113b.

On the other hand, the top FET 120 is disposed over the bottom FET 110. The top FET 120 includes at least a second active region 121, two metal contact regions 122 and a gate region (i.e., poly region) 123. For example, the top FET 120 may include, among other things, the second active region 121, a metal contact region 122a, a metal contact region 122b and a gate region 123a. In this embodiment, the second active region 121 is disposed on a second horizontal plane 102. The second horizontal plane 102 is in a X-Y plane which is perpendicular to the vertical direction (Z). The second horizontal plane 102 is over the first horizontal plane 101. The second active region 121 may define an active region where transistors may be constructed. In this embodiment, the second active region 121 is a second conductivity type (e.g., p-type). It should be noted that the second active region 121 may be a first conductivity type (e.g., n-type). In this embodiment, the metal contact regions 122a and 122b are disposed over the second active region 121. One of the metal contact regions 122a and 122b may serve as a source of the top FET 120, and the other may serve as a drain of the top FET 120. In one example, the metal contact region 122a may serve as a source of the top FET 120, whereas the metal contact region 122b may serve as a drain of the of the top FET 120. A source contact and a drain contact may be further disposed over the metal contact regions 122a and 122b to form a source terminal and a drain terminal of the top FET 120. In this embodiment, the gate region 123a is interposed between the metal contact regions 122a and 122b. The gate region 123a is adjacent to multiple (e.g., three or four) side surfaces of the second active region 121. The gate region 123a may serve as a gate of the top FET 120. It should be noted that the gate region 123a and the gate region 113a may be the same in this embodiment. In other words, the gate region 113a/123a is connected rather than separated. A gate electrode may be further disposed around the gate region 123a to form a gate terminal of the top FET 120. It should be noted that the top FET 120 may include another combination of components. For instance, the top FET 120 may include, among other things, the second active region 121, a metal contact region 122b, a metal contact region 122c and a gate region 123b. It should be noted that the gate region 123b and the gate region 123a may be the same in this embodiment. In other words, the gate region 113b/123b is connected rather than separated.

As shown in FIG. 1A, multiple conductive lines 131 are disposed over the top FET 120. The multiple conductive lines 131 are disposed on a third horizontal plane 103. The third horizontal plane 103 is in a X-Y plane which is perpendicular to the vertical direction (Z). The third horizontal plane 103 is over the second horizontal plane 102.

In some embodiments, multiple conductive lines 131 are metal tracks 131, collectively referred to as a metal zero (M0) layer. It should be noted that different number of the metal tracks 131 may be employed as needed, and various layouts of the metal tracks 131 may be employed as needed.

The metal tracks 131 may be used to electrically connect different terminals of the bottom FET 110 and the top FET 120 as needed. For instance, one of the metal tracks 131 may be electrically connected to a drain terminal (e.g., disposed over the metal contact region 112b) of the bottom FET 110.

As shown in FIG. 1A, the first active region 111 and the second active region 121 do not fully overlap when viewed from the vertical direction (Z), i.e., when viewed from above for example. In other words, a projection of the second active region 121 on the first horizontal plane 101 and the first active region 111 do not fully overlap. In the illustrated example shown in FIG. 1A, the second active region 121 has a projection 121' on the first horizontal plane 101. The projection 121' of the second active region 121 does not fully overlap with the first active region 111. In some embodiments, the projection 121' of the second active region 121 and the first active region 111 partially overlap. In some embodiments, the projection 121' of the second active region 121 and the first active region 111 do not overlap at all. In some embodiments, an area of the first active region 111 is larger than an area of the second active region 121. In some embodiments, the area of the first active region 111 is equal to the area of the second active region 121. In some embodiments, the area of the first active region 111 is smaller than the area of the second active region 121.

Cross sectional views in FIGS. 1B and 1C further illustrate the example CFET 100 shown in FIG. 1A. As shown in the cross sectional view in FIG. 1B, the first active region 111 of the bottom FET 110 is disposed over a substrate 190 and on the first horizontal plane 101. The second active region 121 of the top FET 120 is disposed on the second horizontal plane 102 which is over the first horizontal plane 101. The multiple conductive lines 131 (e.g., the multiple metal tracks 131) are disposed on the third plane 103 which is over the second horizontal plane 102. The second active region 121 has the projection 121' on the first horizontal plane 101. The projection 121' of the second active region 121 on the first horizontal plane 101 does not fully overlap with the first active region 111 when viewed in the X direction, such as from above. The second active region 121 does not intervene between at least a portion of the first active region 111 (in this example, the entire first active region 111) and the multiple conductive lines 131 in the vertical direction (Z). As such, more routing flexibility of the bottom FET 110 is created.

As shown in the cross sectional view in FIG. 1C, in the first horizontal plane 101, the bottom FET 110 includes, among other things, the first active region 111 and the gate region 113a which is adjacent to at least two side surfaces of the first active region 111. The second active region 121 has the projection 121' on the first horizontal plane 101. The projection 121' of the second active region 121 on the first horizontal plane 101 does not fully overlap with the first active region 111. As such, more routing flexibility of the bottom FET 110 is created, as explained above.

Figure 2:
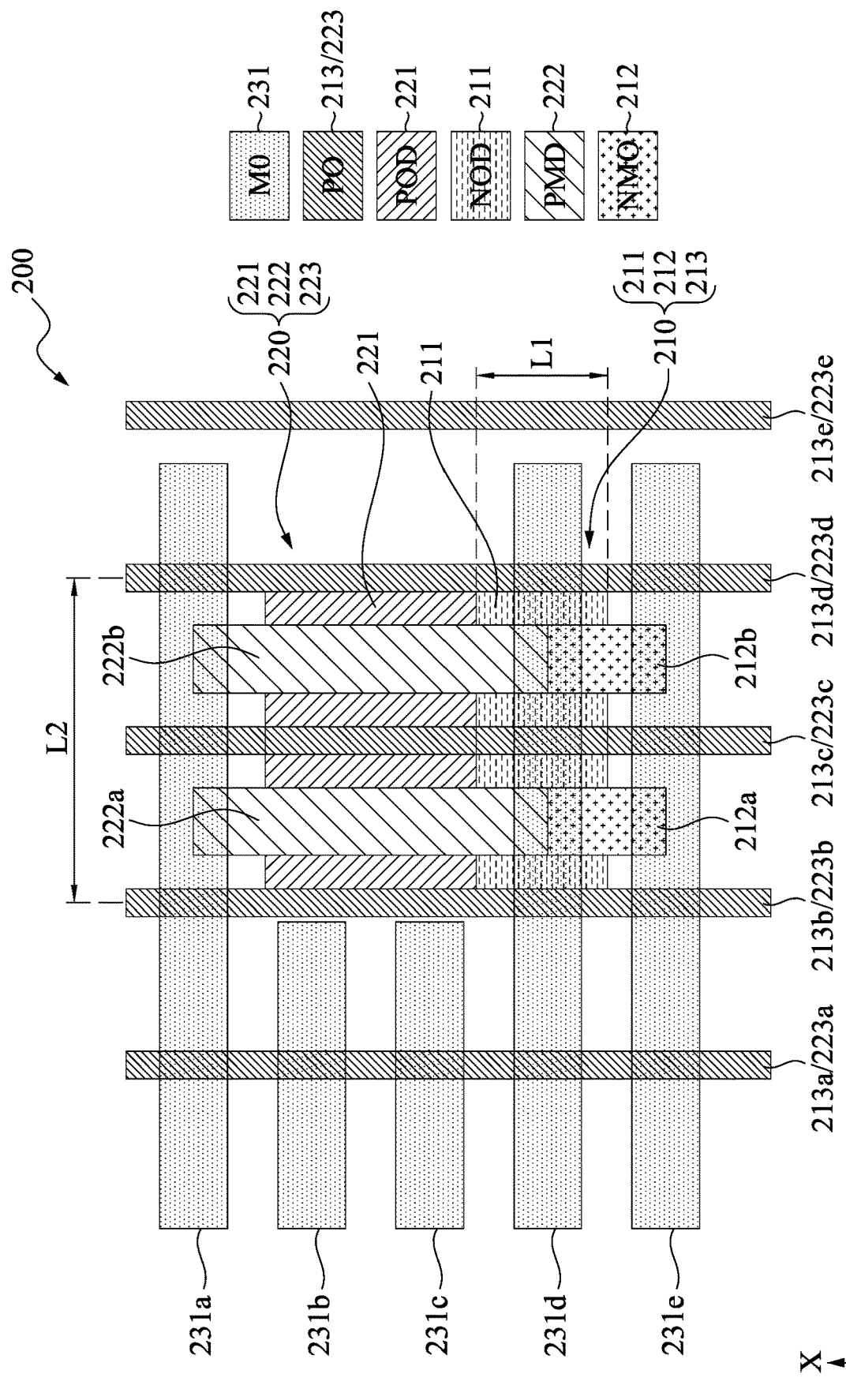
FIG. 2 is a layout diagram illustrating an example of a CFET in accordance with some embodiments.

FIG. 2 shows an example layout of a CFET 200 in accordance with some embodiments. FIG. 2 is a top view of the example CFET 200. As illustrated, the example CFET 200 includes at least a bottom FET 210 and a top FET 220. The bottom FET 210 is disposed over a substrate (not shown for clarity). The bottom FET 210 includes at least a first active region 211, two metal contact regions 212 and a gate region (i.e., poly region) 213c. In this embodiment, the first active region 211 is disposed on a first horizontal plane. The first horizontal plane is in a X-Y plane which is perpendicular to the vertical direction (Z). The first active region 211 may define an active region where transistors may be constructed. In this embodiment, the first active region 211 is a first conductivity type (e.g., n-type). It should be noted that the first active region 211 may be a second conductivity type (e.g., p-type) in other examples. In this embodiment, the metal contact regions 212a and 212b are disposed over the first active region 211. One of the metal contact regions 212a and 212b may serve as a source of the bottom FET 210, and the other may serve as a drain of the bottom FET 210. In one example, the metal contact region 212a may serve as a source of the bottom FET 210, whereas the metal contact region 212b may serve as a drain of the of the bottom FET 210. A source contact and a drain contact may be further disposed over the metal contact regions 212a and 212b to form a source terminal and a drain terminal of the bottom FET 210. In this embodiment, the gate region 213c is interposed between the metal contact regions 212a and 212b. The gate region 213c is adjacent to multiple (e.g., three or four) side surfaces of the first active region 211. The gate region 213c may serve as a gate of the bottom FET 210. A gate electrode may be further disposed around the gate region 213c to form a gate terminal of the bottom FET 210. It should be noted that other gate regions 213a, 213b, 213d and 213e are parallel to the gate region 213c and may be used as gates of other semiconductor devices (e.g., other CFETs) which are not shown for clarity.

On the other hand, the top FET 220 is disposed over the bottom FET 210. The top FET 220 includes at least a second active region 221, two metal contact regions 222 and a gate region (i.e., poly region) 223c. In this embodiment, the second active region 221 is disposed on a second horizontal plane. The second horizontal plane is in a X-Y plane which is perpendicular to the vertical direction (Z). The second horizontal plane is over the first horizontal plane. The second active region 221 may define an active region where transistors may be constructed. In this embodiment, the second active region 221 is a second conductivity type (e.g., p-type). It should be noted that the second active region 221 may be a first conductivity type (e.g., n-type) in other examples. In this embodiment, the metal contact regions 222a and 222b are disposed over the second active region 221. One of the metal contact regions 222a and 222b may serve as a source of the top FET 220, and the other may serve as a drain of the top FET 220. In one example, the metal contact region 222a may serve as a source of the top FET 220, whereas the metal contact region 222b may serve as a drain of the of the top FET 220. A source contact and a drain contact may be further disposed over the metal contact regions 222a and 222b to form a source terminal and a drain terminal of the top FET 220. In this embodiment, the gate region 223c is interposed between the metal contact regions 222a and 222b. The gate region 223c is adjacent to multiple (e.g., three or four) side surfaces of the second active region 221. The gate region 223c may serve as a gate of the top FET 220. It should be noted that the gate region 223c and the gate region 213c may be the same in this embodiment. In other words, the gate region 213c/223c is connected rather than separated. A gate electrode may be further disposed around the gate region 223c to form a gate terminal of the top FET 220.

Multiple conductive lines 231 are disposed over the top FET 220. The multiple conductive lines 231 are disposed on a third horizontal plane. The third horizontal plane is in a X-Y plane which is perpendicular to the vertical direction (Z). The third horizontal plane is over the second horizontal plane 102. In some embodiments, multiple conductive lines 231 are metal tracks 231, collectively referred to as a M0 layer. It should be noted that different number of the metal tracks 231 may be employed as needed, and various layouts of the metal tracks 231 may be employed as needed. The metal tracks 231 may be used to be electrically connected to different terminals of the bottom FET 210 and the top FET 220 as needed. For instance, the metal tracks 131 may be used to be electrically connected to a drain terminal (e.g., disposed over the metal contact region 112b) of the bottom FET 110.

The first active region 211 and the second active region 221 do not fully overlap when viewed from the vertical direction (Z). Specifically, a projection of the second active region 221 on the first horizontal plane does not fully overlap with the first active region 211 when viewed from above as shown in FIG. 2. A portion of the first active region 211 that does not overlap with the projection of the second active region 221 on the first horizontal plane has a rectangular shape, with a length L1 in the X direction and a length L2 in the Y direction. Due to the non-overlapping portion, the first active region 211 and the second active region 221 do not fully overlap when viewed from the vertical direction (Z). Accordingly, the metal contact region 212a and the metal contact region 222a do not fully overlap when viewed from the vertical direction (Z), whereas the metal contact region 212b and the metal contact region 222b do not fully overlap when viewed from the vertical direction (Z).

The second active region 221 does not intervene between at least a portion of the first active region 211 (in this example, rectangular shape portion) and the conductive line 231d in the vertical direction (Z). Likewise, the metal contact region 222a does not intervene between at least a portion of the metal contact region 212a and the conductive lines 231d and 231e, whereas the metal contact region 222b does not intervene between at least a portion of the metal contact region 212b and the conductive lines 231d and 231e. For instance, the conductive line 231e can be electrically connected, downward in the vertical direction (Z), to the metal contact region 212a (through a source/drain contact not shown for clarity) without passing through the metal contact region 222a. As such, more routing flexibility of the bottom FET 110 is created.

Figure 3A:
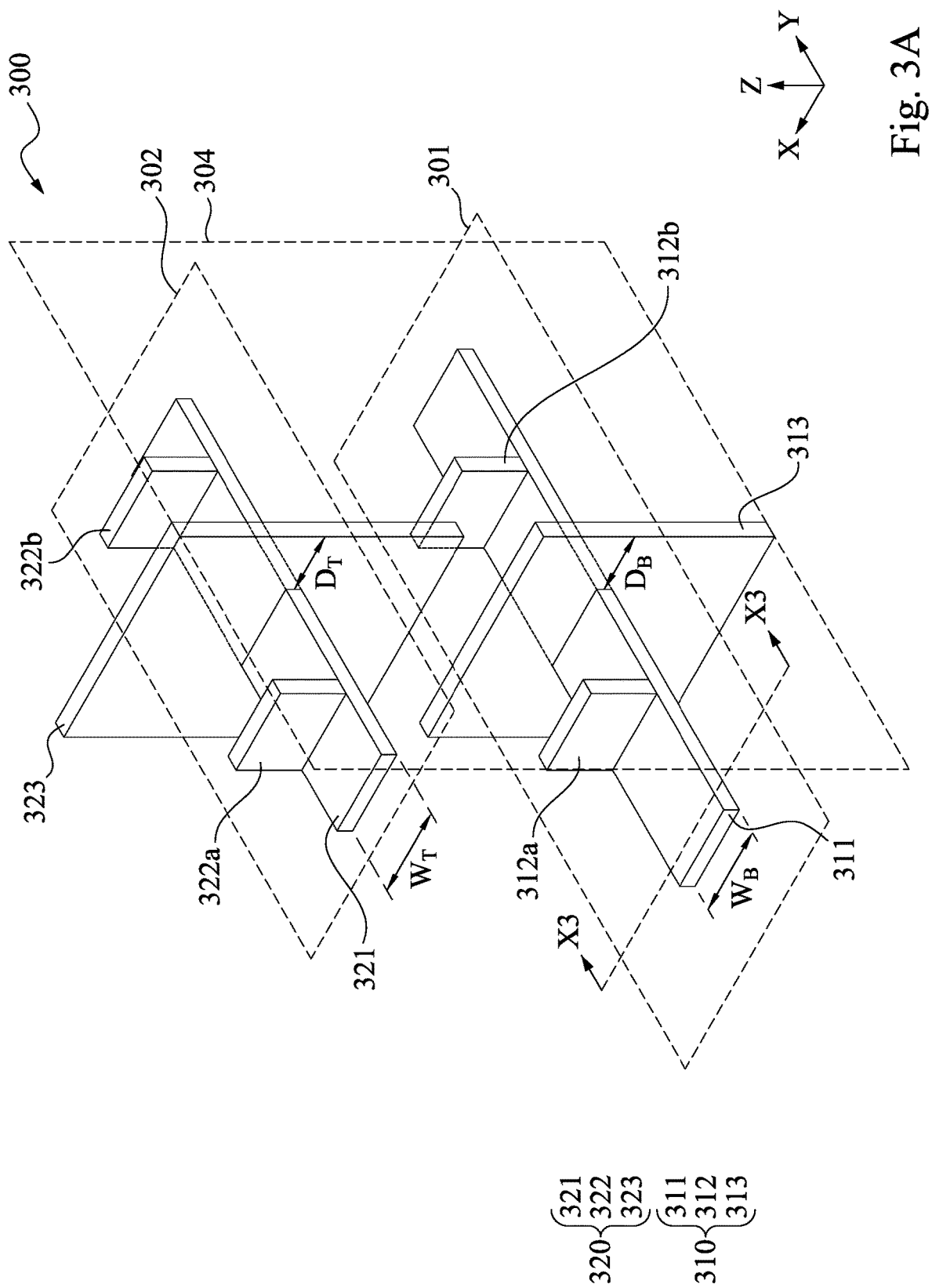
FIG. 3A is a perspective diagram illustrating an example of a CFET in accordance with some embodiments.
Figure 3B:
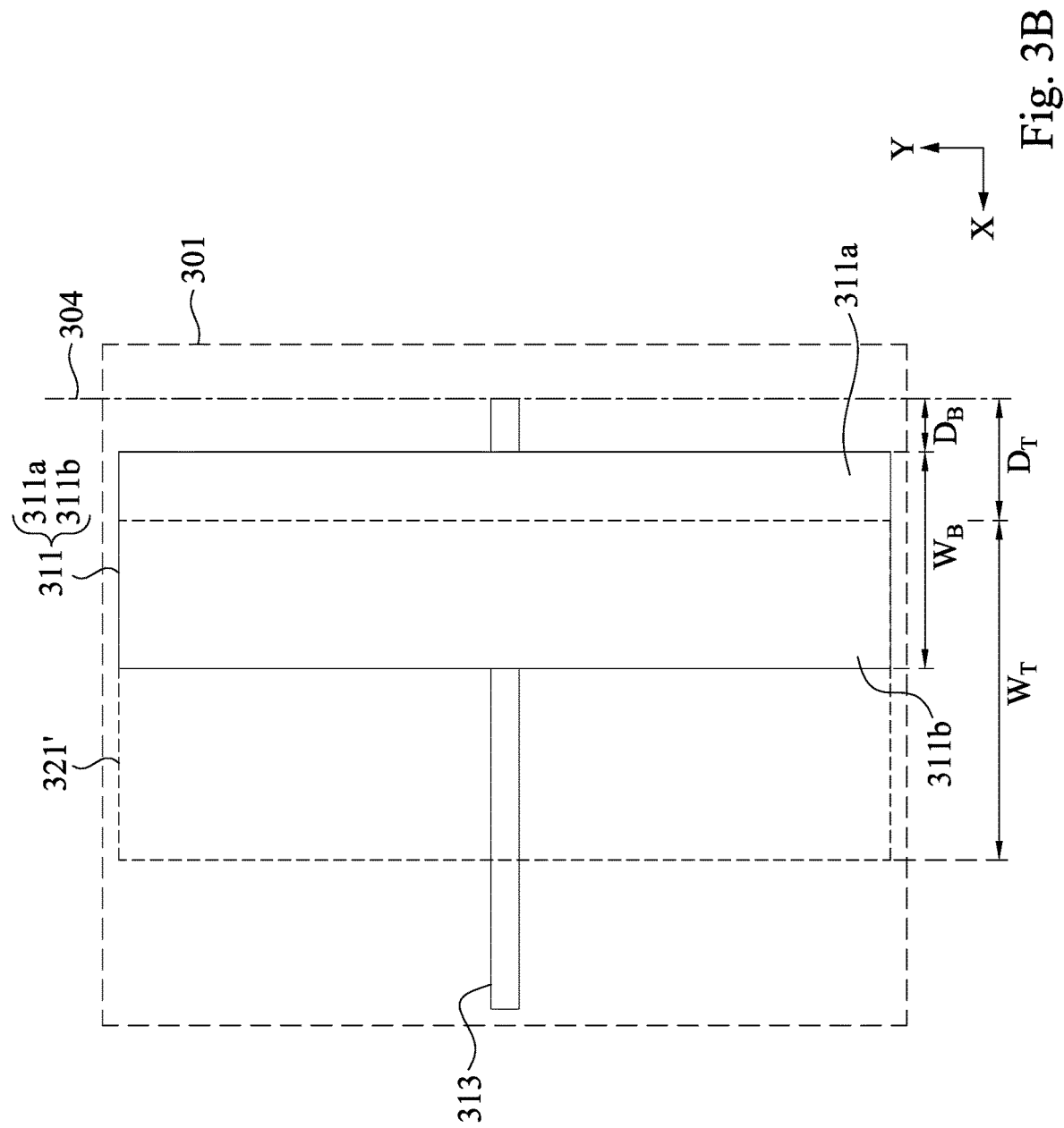
FIG. 3B is a cross sectional diagram illustrating the example CFET shown in FIG. 3A in accordance with some embodiments.

FIGS. 3A and 3B show an example of a CFET 300 in accordance with some embodiments. Specifically, FIG. 3A is a perspective view of the CFET 300. FIG. 3B is a cross-sectional view corresponding to a line X3-X3 of FIG. 3A.

As shown in FIG. 3A, the example CFET 300 includes at least a bottom FET 310 and a top FET 320. The bottom FET 310 is disposed over a substrate (not shown for clarity). The bottom FET 210 includes at least a first active region 311, two metal contact regions 312 and a gate region (i.e., poly region) 313. In this embodiment, the first active region 311 is disposed on a first horizontal plane 301. The first horizontal plane 301 is on a X-Y plane which is perpendicular to the vertical direction (Z). The first active region 311 may define an active region where transistors may be constructed. In this embodiment, the first active region 311 is a first conductivity type (e.g., n-type). It should be noted that the first active region 311 may be a second conductivity type (e.g., p-type) in other examples. In this embodiment, the metal contact regions 312a and 312b are disposed over the first active region 311. One of the metal contact regions 312a and 312b may serve as a source of the bottom FET 310, and the other may serve as a drain of the bottom FET 310. In one example, the metal contact region 312a may serve as a source of the bottom FET 310, whereas the metal contact region 312b may serve as a drain of the of the bottom FET 310. A source contact and a drain contact may be further disposed over the metal contact regions 312a and 312b to form a source terminal and a drain terminal of the bottom FET 310. In this embodiment, the gate region 313 is interposed between the metal contact regions 312a and 312b. The gate region 313 is adjacent to multiple (e.g., three or four) side surfaces of the first active region 311. The gate region 313 may serve as a gate of the bottom FET 310. A gate electrode may be further disposed around the gate region 313 to form a gate terminal of the bottom FET 310.

On the other hand, the top FET 320 is disposed over the bottom FET 310. The top FET 320 includes at least a second active region 321, two metal contact regions 322 and a gate region (i.e., poly region) 323. In this embodiment, the second active region 321 is disposed on a second horizontal plane 302. The second plane is in a X-Y plane which is perpendicular to the vertical direction (Z). The second horizontal plane 302 is over the first horizontal plane 301. The second active region 321 may define an active region where transistors may be constructed. In this embodiment, the second active region 321 is a second conductivity type (e.g., p-type). It should be noted that the second active region 321 may be a first conductivity type (e.g., n-type) in other examples. In this embodiment, the metal contact regions 322a and 322b are disposed over the second active region 321. One of the metal contact regions 322a and 322b may serve as a source of the top FET 320, and the other may serve as a drain of the top FET 320. In one example, the metal contact region 322a may serve as a source of the top FET 320, whereas the metal contact region 322b may serve as a drain of the of the top FET 320. A source contact and a drain contact may be further disposed over the metal contact regions 322a and 322b to form a source terminal and a drain terminal of the top FET 320. In this embodiment, the gate region 323 is interposed between the metal contact regions 322a and 322b. The gate region 323 is adjacent to multiple (e.g., three or four) side surfaces of the second active region 321. The gate region 323 may serve as a gate of the top FET 320. It should be noted that the gate region 323 and the gate region 313 are separated rather than connected in this embodiment. A gate electrode may be further disposed around the gate region 323 to form a gate terminal of the top FET 320.

Multiple conductive lines (not shown for clarity) may be disposed over the top FET 320. The multiple conductive lines are disposed on a third plane (not shown for clarity) which is in a X-Y plane and over the second horizontal plane 302. In some embodiments, multiple conductive lines are metal tracks, collectively referred to as a M0 layer.

As shown in FIG. 3A, a reference plane 304 is a Y-Z plane which is perpendicular to a horizontal direction (X). The first active region 311 has a distance $D_B$ with respect to the reference plane 304 in the X direction. The second active region 321 has a distance $D_T$ with respect to the reference plane 304 in the X direction. The first active region 311 has a width $W_B$ in the X direction. The second active region 321 has a width $W_T$ in the X direction. The relationships among $D_B$, $D_T$, $W_B$ and $W_T$ will be discussed in detail with reference to FIG. 3B.

As shown in FIG. 3B, in the first horizontal plane 301, the bottom FET 310 includes, among other things, the first active region 311 and the gate region 313 which is adjacent to at least two side surfaces of the first active region 311. The second active region 321 has the projection 321' on the first horizontal plane 301. The projection 321' of the second active region 321 on the first horizontal plane 301 does not fully overlap with the first active region 311. In other words, the first active region 311 and the projection 321' of the second active region 321 do not fully overlap when viewed from the vertical direction (Z). The second active region 321 does not intervene between at least a portion of the first active region 311 (in this example, a portion 311a of the first active region 311 which includes two portions 311a and 311b) and the multiple conductive lines in the vertical direction (Z). As such, more routing flexibility of the bottom FET 110 is created, as explained above.

Moreover, in some embodiments, the distance $D_B$ may be smaller than the distance $D_T$. In some embodiments, the distance $D_B$ may be the same as the distance $D_T$. In some embodiments, the distance $D_B$ may be larger than the distance $D_T$. In some embodiments, the width $W_B$ may be smaller than the width $W_T$. In some embodiments, the width $W_B$ may be the same as the width $W_T$. In some embodiments, the width $W_B$ may be larger than the width $W_T$. In other words, various combinations of the relationship between $D_B$ and $D_T$ and the relationship between $W_B$ and $W_T$ are within the contemplated scope of the present disclosure.

Figure 4:
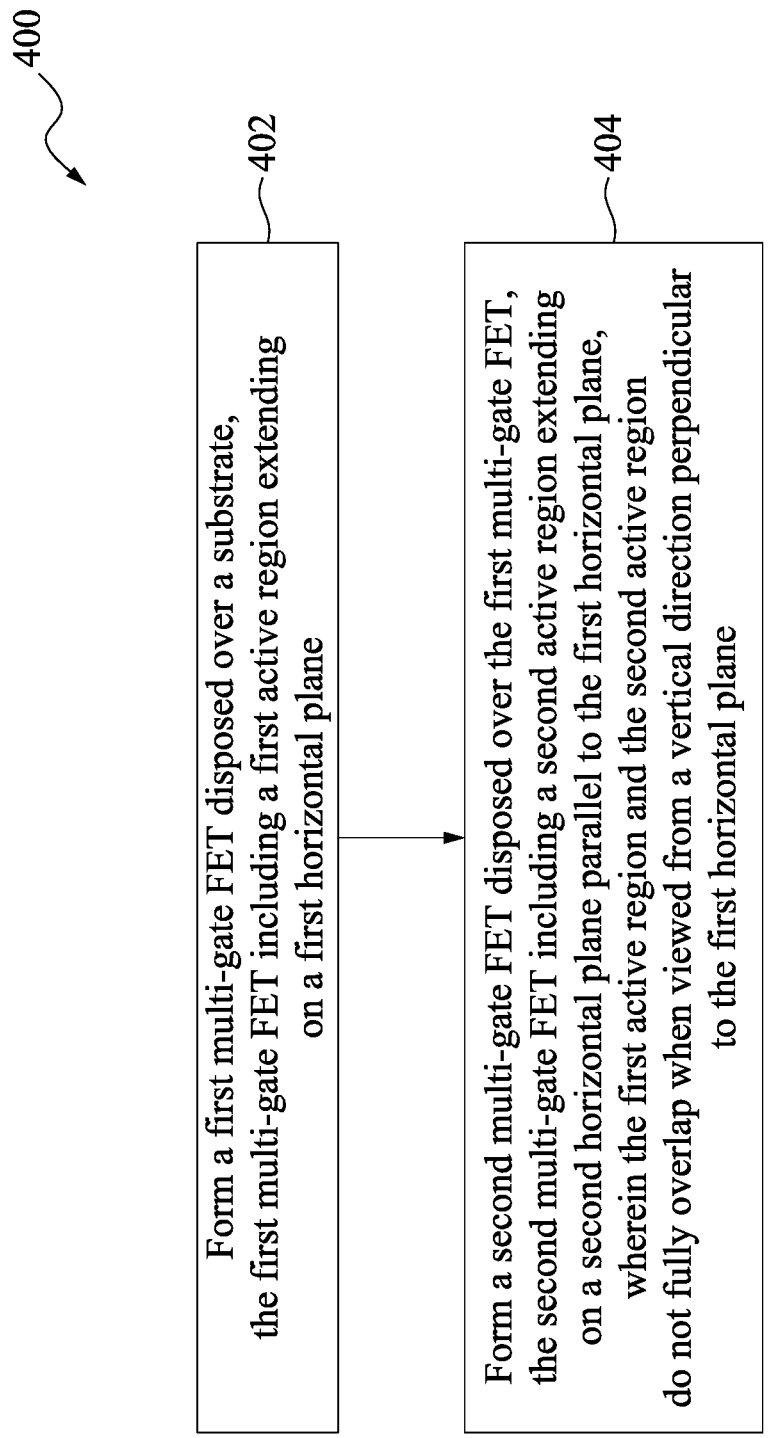
FIG. 4 is a flow diagram illustrating an example of a method for forming a CFET in accordance with some embodiments.

FIG. 4 is a flow diagram illustrating an example of a method 400 for forming a semiconductor device, such as the example CFET 100 shown in FIG. 1A. At step 402, a first multi-gate FET such as the bottom FET 110 shown in FIG. 1A disposed over a substrate is formed. The first multi-gate FET includes a first active region extending on a first horizontal plane. At step 404, a second multi-gate FET such as the top FET 120 shown in FIG. 1A disposed over the first multi-gate FET is formed. The second multi-gate FET includes a second active region extending on a second horizontal plane parallel to the first horizontal plane. The first active region and the second active region do not fully overlap when viewed from a vertical direction perpendicular to the first horizontal plane.

In accordance with some disclosed embodiments, a semiconductor device may be provided. The semiconductor device includes: a first multi-gate field effect transistor (FET) disposed over a substrate, the first multi-gate FET including a first active region extending on a first horizontal plane; and a second multi-gate FET disposed over the first multi-gate FET, the second multi-gate FET including a second active region extending on a second horizontal plane parallel to the first horizontal plane. The first active region and the second active region do not fully overlap when viewed from a vertical direction perpendicular to the first horizontal plane.

In accordance with some disclosed embodiments, a semiconductor device may be provided. The semiconductor device includes: a substrate; a first multi-gate FET disposed over the substrate, the first multi-gate FET including a first active region extending on a first horizontal plane parallel to the substrate and having a first projection of the first active region on the substrate; and a second multi-gate FET disposed over the first multi-gate FET, the second multi-gate FET including a second active region extending on a second horizontal plane parallel to the substrate and having a second projection of the second active region on the substrate. The first projection and the second projection do not fully overlap.

In accordance with further disclosed embodiments, a method for forming a semiconductor device may be provided. The method includes: forming a first multi-gate FET disposed over a substrate, the first multi-gate FET including a first active region extending on a first horizontal plane; and forming a second multi-gate FET disposed over the first multi-gate FET, the second multi-gate FET including a second active region extending on a second horizontal plane parallel to the first horizontal plane. The first active region and the second active region do not fully overlap when viewed from a vertical direction perpendicular to the first horizontal plane.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first multi-gate field effect transistor (FET) disposed over a substrate, the first multi-gate FET including a first active region extending on a first horizontal plane; and
a second multi-gate FET disposed over the first multi-gate FET, the second multi-gate FET including a second active region extending on a second horizontal plane parallel to the first horizontal plane;
wherein the first active region and the second active region do not fully overlap when viewed from a vertical direction perpendicular to the first horizontal plane;
wherein the first multi-gate FET further includes a first metal contact region disposed over the first active region and a second metal contact region disposed over the first active region;
wherein the second multi-gate FET further includes a third metal contact region disposed over the second active region and a fourth metal contact region disposed over the second active region; and
wherein the first metal contact region and the third metal contact region do not fully overlap when viewed from the vertical direction, and the first metal contact region and the fourth metal contact region do not fully overlap when viewed from the vertical direction.

2. The semiconductor device of claim 1, wherein the first active region and the second active region have different conductivity types from each other.

3. The semiconductor device of claim 1, wherein a first projection of the second active region on the first horizontal plane partially overlaps with the first active region.

4. The semiconductor device of claim 1, wherein a first projection of the second active region on the first horizontal plane and the first active region do not overlap.

5. The semiconductor device of claim 1, wherein a first area of the first active region is smaller than a second area of the second active region.

6. The semiconductor device of claim 1, wherein a first area of the first active region is equal to a second area of the second active region.

7. The semiconductor device of claim 1, wherein a first area of the first active region is larger than a second area of the second active region.

8. The semiconductor device of claim 1, wherein the second metal contact region and the third metal contact region do not fully overlap when viewed from the vertical direction, and the second metal contact region and the fourth metal contact region do not fully overlap when viewed from the vertical direction.

9. The semiconductor device of claim 1, wherein the first multi-gate FET includes a first gate region adjacent to a plurality of side surfaces of the first active region, and the second multi-gate FET includes a second gate region adjacent to a plurality of side surfaces of the second active region.

10. The semiconductor device of claim 9, wherein the first gate region and the second gate region are separate.

11. The semiconductor device of claim 9, wherein the first gate region and the second gate region are connected.

12. The semiconductor device of claim 1, wherein a first width of the first active region is equal to a second width of the second active region.

13. The semiconductor device of claim 1, wherein a first width of the first active region is different from a second width of the second active region.

14. A semiconductor device, comprising:
a substrate;
a first multi-gate FET disposed over the substrate, the first multi-gate FET including a first active region extending on a first horizontal plane parallel to the substrate and having a first projection of the first active region on the substrate; and
a second multi-gate FET disposed over the first multi-gate FET, the second multi-gate FET including a second active region extending on a second horizontal plane parallel to the substrate and having a second projection of the second active region on the substrate;
wherein the first projection and the second projection do not fully overlap;
wherein the first multi-gate FET further includes a first metal contact region disposed over the first active region and a second metal contact region disposed over the first active region;
wherein the second multi-gate FET further includes a third metal contact region disposed over the second active region and a fourth metal contact region disposed over the second active region; and
wherein the first metal contact region and the third metal contact region do not fully overlap when viewed from the vertical direction, and the first metal contact region and the fourth metal contact region do not fully overlap when viewed from the vertical direction.

15. The semiconductor device of claim 14, wherein the first projection and the second projection do not overlap.

16. The semiconductor device of claim 14, wherein the first projection and the second projection partially overlap.

17. A method for forming a semiconductor device, comprising:
forming a first multi-gate FET disposed over a substrate, the first multi-gate FET including a first active region extending on a first horizontal plane; and
forming a second multi-gate FET disposed over the first multi-gate FET,
the second multi-gate FET including a second active region extending on a second horizontal plane parallel to the first horizontal plane,
wherein the first active region and the second active region do not fully overlap when viewed from a vertical direction perpendicular to the first horizontal plane,
wherein the first multi-gate FET includes a first metal contact region disposed over the first active region and a second metal contact region disposed over the first active region,
wherein the second multi-gate FET further includes a third metal contact region disposed over the second active region and a fourth metal contact region disposed over the second active region, and wherein the first metal contact region and the third metal contact region do not fully overlap when viewed from the vertical direction, and the first metal contact region and the fourth metal contact region do not fully overlap when viewed from the vertical direction.

18. The method of claim 17, wherein the first active region and the second active region have different conductivity types from each other.

19. The method of claim 17, wherein a first projection of the second active region on the first horizontal plane partially overlaps with the first active region.

20. The semiconductor device of claim 14, wherein a first area of the first active region is smaller than a second area of the second active region.

* * * * *